(12) United States Patent
Imai et al.

(10) Patent No.: US 12,348,196 B2
(45) Date of Patent: Jul. 1, 2025

(54) SEMICONDUCTOR CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Shigeo Imai, Chiba Chiba (JP); Naoya Waki, Kawasaki Kanagawa (JP); Munenori Sakai, Kawasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 627 days.

(21) Appl. No.: 17/690,318

(22) Filed: Mar. 9, 2022

(65) Prior Publication Data

US 2023/0089685 A1   Mar. 23, 2023

(30) Foreign Application Priority Data

Sep. 21, 2021  (JP) .................................. 2021-153422
Feb. 2, 2022   (JP) .................................. 2022-015088

(51) Int. Cl.
  *H03F 3/08*   (2006.01)
  *H03F 1/52*   (2006.01)
  *H03F 3/45*   (2006.01)

(52) U.S. Cl.
  CPC .............. *H03F 3/087* (2013.01); *H03F 1/52* (2013.01); *H03F 3/082* (2013.01); *H03F 3/45475* (2013.01)

(58) Field of Classification Search
  CPC . H03F 3/087; H03F 1/52; H03F 3/082; H03F 3/45475
  See application file for complete search history.

(56) References Cited

U.S. PATENT DOCUMENTS

| 5,498,993 A    | 3/1996 | Ohtsuka et al. |
| 2007/0120146 A1 | 5/2007 | Chang et al. |
| (Continued) | | |

FOREIGN PATENT DOCUMENTS

| JP | H06283983 A | 10/1994 |
| JP | 2006050145 A | 2/2006 |
| (Continued) | | |

OTHER PUBLICATIONS

Salvatori, S. ("Instrumentation amp makes an accurate transimpedance amp too" Mar. 23, 2015, EDN (Year: 2015).*

(Continued)

*Primary Examiner* — Hafizur Rahman
(74) *Attorney, Agent, or Firm* — Kim & Stewart LLP

(57) ABSTRACT

According to one embodiment, a semiconductor circuit includes a first transimpedance amplifier and a second transimpedance amplifier. The first transimpedance amplifier is configured to convert an input current to a first output voltage and output the first output voltage from a first output terminal when a reference voltage is supplied to a first input terminal and the input current is supplied to a second input terminal. The second transimpedance amplifier has a circuit configuration similar to a circuit configuration of the first transimpedance amplifier. The second transimpedance amplifier is configured to output a second output voltage from a second output terminal when the reference voltage is supplied to a third input terminal.

16 Claims, 6 Drawing Sheets

(56) References Cited

U.S. PATENT DOCUMENTS

| | | | |
|---|---|---|---|
| 2013/0120059 | A1 | 5/2013 | Oku |
| 2014/0117212 | A1 | 5/2014 | Imai et al. |

FOREIGN PATENT DOCUMENTS

| | | | |
|---|---|---|---|
| JP | 2007151064 | A | 6/2007 |
| JP | 2009049488 | A | 3/2009 |
| JP | 2013106325 | A | 5/2013 |
| JP | 2014090257 | A | 5/2014 |
| JP | 2017096886 | A | 6/2017 |
| JP | 2017112518 | A | 6/2017 |
| JP | 6647627 | B2 | 2/2020 |
| JP | 2020178261 | A | 10/2020 |
| WO | 2020126475 | A1 | 6/2020 |

OTHER PUBLICATIONS

Notice of Reasons for Refusal (Office Action) dated Feb. 4, 2025 in corresponding Japanese Patent Application No. 2022-015088 with English machine translation (12 pages).

\* cited by examiner

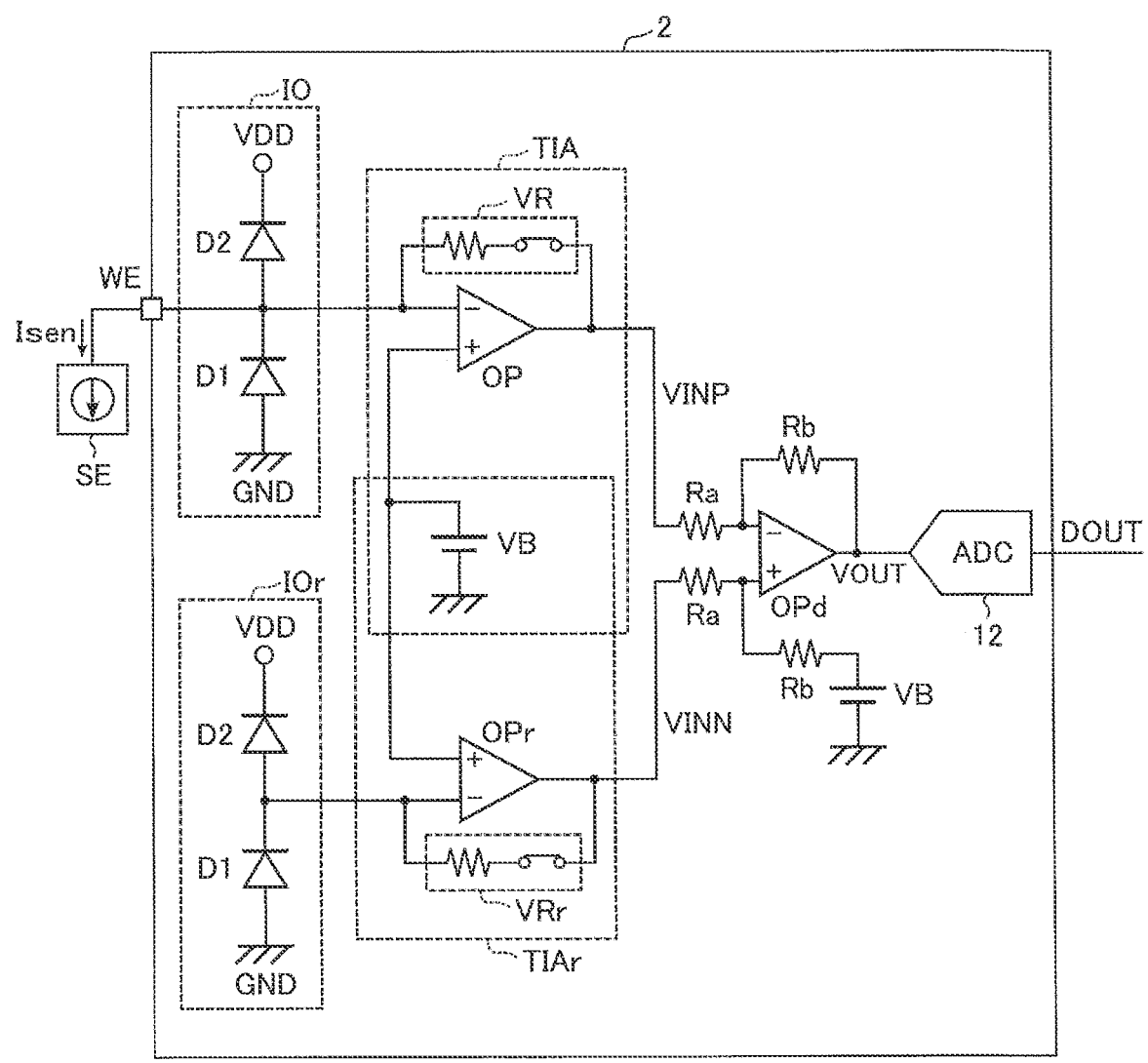
F I G. 6

SEMICONDUCTOR CIRCUIT

CROSS-REFERENCE TO RELATED APPLICATIONS

This application is based upon and claims the benefit of priority from Japanese Patent Applications No. 2021-153422, filed Sep. 21, 2021; and No. 2022-015088, filed Feb. 2, 2022; the entire contents of which are incorporated herein by reference.

FIELD

Embodiments described herein relate generally to a semiconductor circuit.

BACKGROUND

A transimpedance amplifier for converting an input current to a voltage has been known.

BRIEF DESCRIPTION OF THE DRAWINGS

FIG. 6 is a circuit diagram showing a configuration of a semiconductor circuit according to a second embodiment.

DETAILED DESCRIPTION

In general, according to one embodiment, a semiconductor circuit includes a first transimpedance amplifier and a second transimpedance amplifier. The first transimpedance amplifier has a first input terminal, a second input terminal, and a first output terminal. The first transimpedance amplifier is configured to convert an input current to a first output voltage and output the first output voltage from the first output terminal when a reference voltage is supplied to the first input terminal and the input current is supplied to the second input terminal. The second transimpedance amplifier has a third input terminal, a fourth input terminal, and a second output terminal. The second transimpedance amplifier has a circuit configuration similar to a circuit configuration of the first transimpedance amplifier. The second transimpedance amplifier is configured to output a second output voltage from the second output terminal when the reference voltage is supplied to the third input terminal.

The embodiments of the present invention will be explained below with reference to the drawings. In the explanation, components having the same functions and structures will be referred to by the same reference symbols. The embodiments described below merely indicate exemplary apparatuses or methods for implementing the technical concepts of the embodiments, and the materials, shapes, structures, arrangements, and the like of their structural parts are not limited to the ones described below.

Furthermore, the function blocks can be implemented in the form of hardware, computer software, or a combination thereof. The function blocks are not necessarily distinguished from each other as in the examples described below. For instance, part of the functions may be executed by a function block different from the illustrated function block. The illustrated function blocks may be divided into smaller sub-blocks.

1. EMBODIMENT 1

A semiconductor circuit according to a first embodiment will be described below.

1.1 Configuration of Semiconductor Circuit

Figure 1:
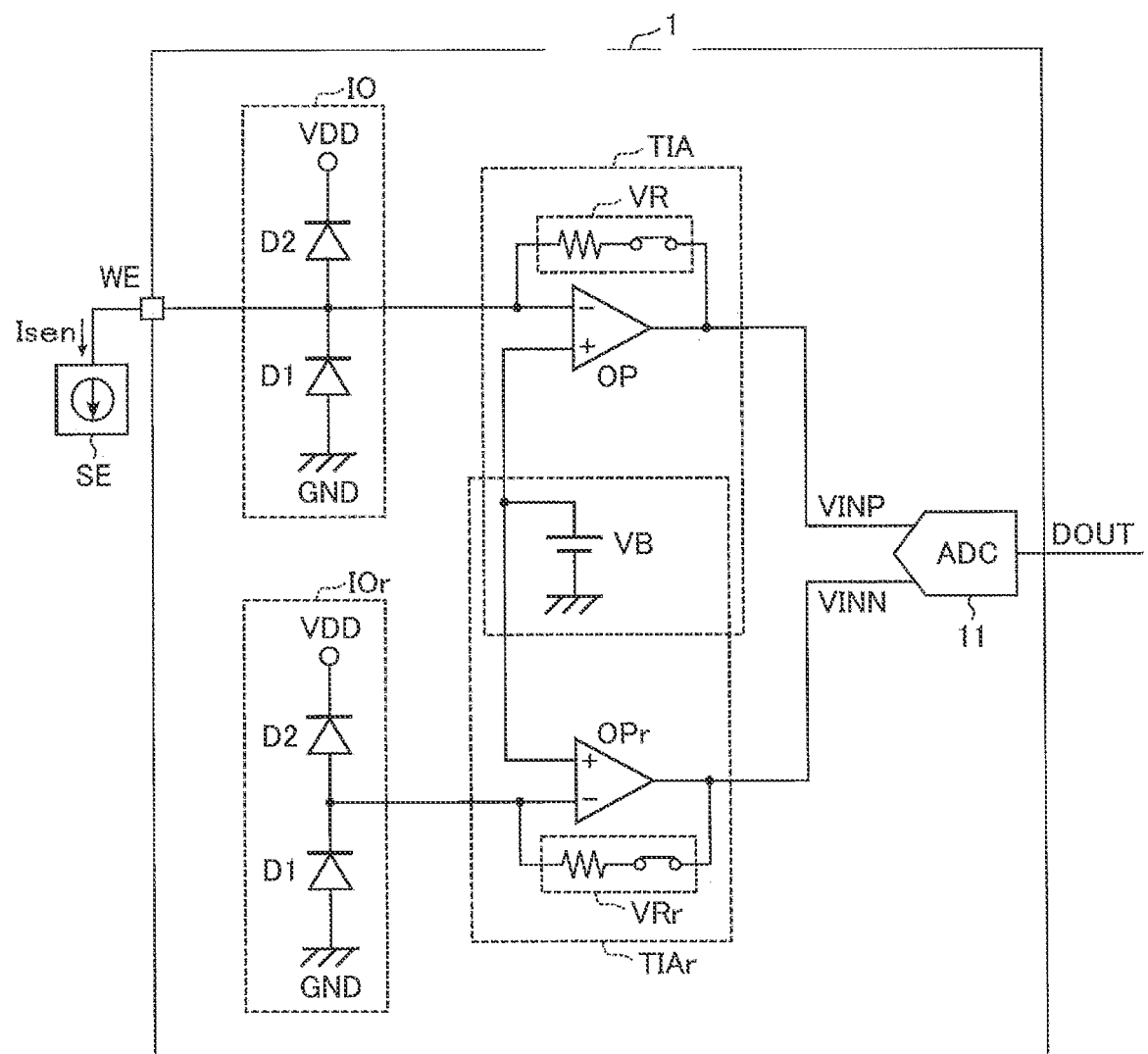
FIG. 1 is a circuit diagram showing a configuration of a semiconductor circuit according to the first embodiment.

FIG. 1 is a circuit diagram showing the configuration of the semiconductor circuit according to the first embodiment. A semiconductor circuit 1 includes two transimpedance amplifiers TIA and TIAr, two input/output circuits IO and IOr for electro-static discharge (ESD) damage protection, a differential input analog-digital conversion circuit (which will also be referred to as an "ADC") 11, and an input terminal WE.

An input current is input to the input terminal WE. Each of the transimpedance amplifiers TIA and TIAr is a circuit configured to convert an input current to a voltage. Specifically, the transimpedance amplifiers respectively perform an impedance conversion and amplification upon the incoming current and output a resultant voltage signal. The transimpedance amplifier TIAr is a replica circuit of the transimpedance amplifier TIA.

The input/output circuit IO is an ESD protection circuit that protects the semiconductor circuit 1 from a surge voltage such as static electricity breaking in from the input terminal WE, or prevents the semiconductor circuit 1 from malfunctioning due to the surge voltage. The input/output circuit IOr is a replica circuit of the input/output circuit IO.

The differential input analog-digital conversion circuit 11 outputs one digital signal from the two output voltages having a differential. That is, the analog-digital conversion circuit 11 receives two output voltages VINP and VINN from the transimpedance amplifiers TIA and TIAr, removes an in-phase signal of the output voltages VINP and VINN, and outputs a digitally converted output signal DOUT.

As mentioned above, the transimpedance amplifier TIAr and input/output circuit IOr are replica circuits of the transimpedance amplifier TIA and input/output circuit IO. That is, the transimpedance amplifier TIAr and input/output circuit IOr have circuit configurations similar to those of the transimpedance amplifier TIA and input/output circuit IO. Specifically, the transimpedance amplifier TIAr includes circuit elements similar to those of the transimpedance amplifier TIA. The circuit elements of the transimpedance amplifier TIAr have approximately the same circuit constants as those of the circuit elements of the transimpedance amplifier TIA. The input/output circuit IOr includes circuit elements similar to those of the input/output circuit IO. The circuit elements of the input/output circuit IOr have approximately the same circuit constants as those of the circuit elements of the input/output circuit IO.

Hereinafter, the path constituted by the input terminal WE, input/output circuit IO, and transimpedance amplifier TIA will be referred to as a measurement signal path, and the path constituted by the replica circuits, which are the input/ output circuit IOr and transimpedance amplifier TIAr, will be referred to as an error (or replica) signal path.

1.1.1 Configuration of Transimpedance Amplifier

Next, the configurations of the transimpedance amplifiers TIA and TIAr will be described.

As illustrated in FIG. 1, the transimpedance amplifier TIA includes an operational amplifier OP, a variable resistance circuit VR, and a voltage source for supplying a reference voltage VB. The operational amplifier OP amplifies an input signal and outputs the resultant signal. The variable resistance circuit VR is a feedback resistor, which is a circuit configured to change its resistance value.

The transimpedance amplifier TIAr includes an operational amplifier OPr, a variable resistance circuit VRr, and a voltage source for supplying the reference voltage VB. The operational amplifier OPr has circuit elements and a circuit constant similar to those of the operational amplifier OP. The variable resistance circuit VRr has circuit elements and a circuit constant similar to those of the variable resistance circuit VR.

The configurations of the variable resistance circuits VR and VRr will be explained below.

Figure 2:
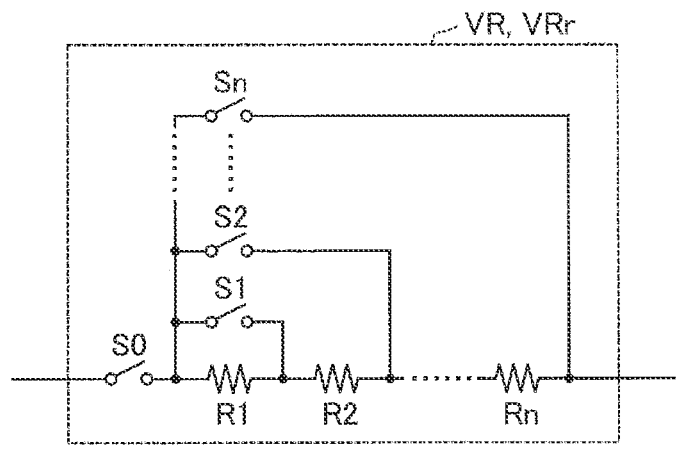
FIG. 2 is a circuit diagram showing a configuration of a variable resistance circuit according to a first embodiment.

FIG. 2 is a circuit diagram showing the configuration of the variable resistance circuit VR (or VRr). The negative input terminal (or inverting input terminal) of the operational amplifier OP is coupled, sequentially via a switch circuit S0, resistors R1, R2, . . . , and Rn (where n is a natural number greater than or equal to 1) coupled in series, to the output terminal of the operational amplifier OP. A switch circuit S1 is coupled between a node between the switch circuit S0 and resistor R1, and a node between the resistor R1 and resistor R2. A switch circuit S2 is coupled between a node between the switch circuit S0 and resistor R1, and a node between the resistor R2 and resistor R3. Similarly, a switch circuit Sn is coupled between a node between the switch circuit S0 and resistor R1, and a node between the resistor Rn and the output terminal of the operational amplifier OP. The configuration of the variable resistance circuit VRr is the same as that of the variable resistance circuit VR.

Figure 3:
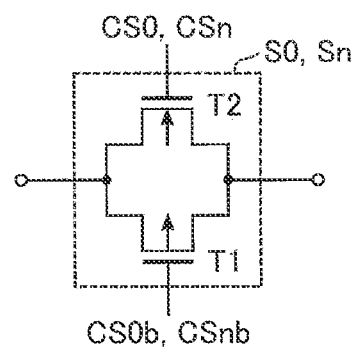
FIG. 3 is a circuit diagram showing a configuration of a switch circuit in the variable resistance circuit according to the first embodiment.

FIG. 3 shows the configuration of the switch circuit S0 or Sn in the variable resistance circuit VR (or VRr). The switch circuit S0 or Sn includes a p-channel MOS field-effect transistor (hereinafter referred to as a "pMOS transistor") T1 and an n-channel MOS field-effect transistor (hereinafter referred to as an "nMOS transistor") T2.

The drain (or source) of the pMOS transistor T1 is coupled to the source (or drain) of the nMOS transistor T2. The source (or drain) of the pMOS transistor T1 is coupled to the drain (or source) of the nMOS transistor T2.

A control signal CS0 is input to the gate of the nMOS transistor T2 of the switch circuit S0. A control signal CS0$b$, which is an inversion signal of the control signal CS0, is input to the gate of the pMOS transistor T1 of the switch circuit S0. A source voltage VDD is supplied to the backgate of the pMOS transistor T1 of the switch circuit S0. Furthermore, a ground voltage GND is supplied to the backgate of the nMOS transistor T2 of the switch circuit S0.

A control signal CSn is input to the gate of the nMOS transistor T2 of the switch circuit Sn. A signal CSnb, which is an inversion signal of the control signal CSn, is input to the gate of the pMOS transistor T1 of the switch circuit Sn. A source voltage VDD is supplied to the backgate of the pMOS transistor T1 of the switch circuit Sn. Furthermore, the ground voltage GND is supplied to the backgate of the nMOS transistor T2 of the switch circuit Sn.

In such a variable resistance circuit VR, the control signals CS0 to CSn and CS0$b$ to CSnb respectively set the switch circuits S0 to Sn to a closed state (or connected state) or an open state (or unconnected state), as a result of which the resistance value RTIA is changed.

As mentioned above, the variable resistance circuit VRr has a circuit configuration similar to that of the variable resistance circuit VR. In a similar manner to the switch circuits of the variable resistance circuit VR, the control signals CS0 to CSn and CS0$b$ to CSnb are input to the switch circuits S0 to Sn of the variable resistance circuit VRr. As a result, the resistance value RTIAr of the variable resistance circuit VRr is set to approximately the same value as the resistance value RTIA of the variable resistance circuit VR.

In the variable resistance circuit VR, a junction leakage current Isw may be generated at a pn junction in the pMOS transistor T1 and nMOS transistor T2 of the switch circuits S0 to Sn. Similarly, in the variable resistance circuit VRr, a junction leakage current Isw may be generated at a pn junction in the pMOS transistor T1 and nMOS transistor T2 of the switch circuits S0 to Sn.

Here, the variable resistance circuit VRr has a circuit configuration similar to that of the variable resistance circuit VR. That is, the variable resistance circuit VRr has circuit elements and a circuit constant similar to those of the variable resistance circuit VR. In particular, the variable resistance circuits VR and VRr both have a pMOS transistor T1, an nMOS transistor T2, and resistors R1 to Rn. The pMOS transistor T1, nMOS transistor T2, and resistors R1 to Rn of the variable resistance circuit VRr have approximately the same circuit constants as those of the pMOS transistor T1, nMOS transistor T2, and resistors R1 to Rn of the variable resistance circuit VR. For this reason, the leakage currents Isw generated in the variable resistance circuits VR and VRr substantially coincide with each other, or in other words they exhibit approximately the same current value.

1.1.2 Configuration of Input/Output Circuit (ESD Protection Circuit)

Next, the configurations of the input/output circuits IO and IOr will be explained.

As illustrated in FIG. 1, in the measurement signal path, the input/output circuit IO is coupled to the negative input terminal of the operational amplifier OP. The input/output circuit IO includes diodes D1 and D2. With regard to the diode D1, a connection is established in a forward direction from the ground voltage node to which the ground voltage GND is supplied, to the node coupled to the negative input terminal. With regard to the diode D2, a connection is established in a forward direction from the node coupled to the negative input terminal, to a source voltage node to which the source voltage VDD is supplied.

On the other hand, in the error signal path, the input/output circuit IOr is coupled to the negative input terminal of the operational amplifier OPr. The input/output circuit IOr has approximately the same circuit elements and circuit constant as those of the input/output circuit IO. In other words, the input/output circuit IOr includes diodes D1 and D2 in a manner similar to the input/output circuit IO. With regard to the diode D1, a connection is established in a forward direction from the ground voltage node to the node coupled to the negative input terminal. With regard to the diode D2, a connection is established in a forward direction from the node of the negative input terminal to the source voltage node.

In the input/output circuit IO, a leakage current Iio may be generated at the pn junction in the diodes D1 and D2 of the input/output circuit IO. Similarly, in the input/output circuit IOr, a leakage current Iio may be generated at the pn junction in the diodes D1 and D2 of the input/output circuit IOr.

Here, the input/output circuit IOr has a circuit configuration similar to that of the input/output circuit IO. In other words, the input/output circuit IOr has circuit elements and a circuit constant similar to those of the input/output circuit IO. In particular, the input/output circuits IO and IOr both include diodes D1 and D2, and the diodes D1 and D2 of the input/output circuit IOr have approximately the same circuit constants as the diodes D1 and D2 of the input/output circuit IO. For this reason, the leakage currents Iio generated in the input/output circuit IO and in the input/output circuit IOr substantially coincide with each other, or in other words they exhibit approximately the same current value.

Figure 4:
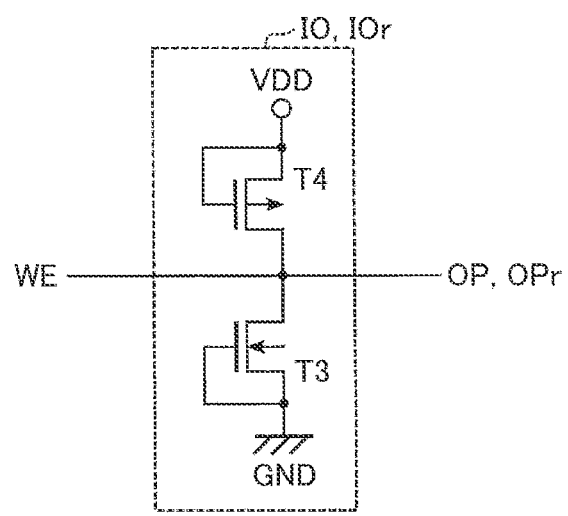
FIG. 4 is a circuit diagram showing an exemplary configuration of an input/output circuit according to the first embodiment.

FIG. 4 is a circuit diagram showing another exemplary configuration of the input/output circuits IO and IOr. The input/output circuit IO may be constituted by an nMOS transistor T3 and a pMOS transistor T4. The gate and drain of the nMOS transistor T3 are coupled to the ground voltage node, while the source of the nMOS transistor T3 is coupled to the negative input terminal of the operational amplifier OP. Furthermore, the gate and drain of the pMOS transistor T4 are coupled to the source voltage node, while the source of the pMOS transistor T4 is coupled to the negative input terminal of the operational amplifier OP.

Similarly, the input/output circuit IOr may be constituted by an nMOS transistor T3 and a pMOS transistor T4. The gate and drain of the nMOS transistor T3 are coupled to the ground voltage node, while the source of the nMOS transistor T3 is coupled to the negative input terminal of the operational amplifier OPr. Furthermore, the gate and drain of the pMOS transistor T4 are coupled to the source voltage node, while the source of the pMOS transistor T4 is coupled to the negative input terminal of the operational amplifier OPr.

In the exemplary configuration of FIG. 4 also, a leakage current Iio may be generated at a junction in the nMOS transistor T3 and pMOS transistor 14 of the input/output circuit IO. Similarly, a leakage current Iio may be generated at a junction in the nMOS transistor T3 and pMOS transistor 14 of the input/output circuit IOr.

Here, the nMOS transistor T3 and pMOS transistor 14 of the input/output circuit IOr have approximately the same circuit constants as those of the nMOS transistor T3 and pMOS transistor 14 of the input/output circuit IO. For this reason, the leakage currents Iio generated in the input/output circuit IO and in the input/output circuit IOr substantially coincide with each other, or in other words they exhibit approximately the same current value.

The circuit connection in the semiconductor circuit 1 according to the first embodiment will be explained below.

As illustrated in FIG. 1, the input terminal WE is coupled to the negative input terminal of the operational amplifier OP in the transimpedance amplifier TIA. The input terminal WE is also coupled to the output terminal of the operational amplifier OP via the variable resistance circuit VR in the transimpedance amplifier TIA. The input/output circuit IO is coupled to the node between the negative input terminal of the operational amplifier OP and the input terminal WE.

A voltage source for supplying a reference voltage VB is coupled to a positive input terminal (or non-inverting input terminal) of the operational amplifier OP. Furthermore, the output terminal of the operational amplifier OP is coupled to a first input terminal of the differential input analog-digital conversion circuit 11.

The input/output circuit IOr is coupled to the negative input terminal of the operational amplifier OPr in the transimpedance amplifier TIAr. The negative input terminal of the operational amplifier OPr is coupled to the output terminal of the operational amplifier OPr via the variable resistance circuit VRr in the transimpedance amplifier TIAr.

The voltage source for supplying the reference voltage VB is coupled to the positive input terminal of the operational amplifier OPr. The output terminal of the operational amplifier OPr is coupled to a second input terminal of the differential input analog-digital conversion circuit 11.

1.2 Operation of Semiconductor Circuit

The operation of the semiconductor circuit 1 according to the first embodiment will be explained below. Here, the operation in which a current output sensor SE is coupled to the input terminal WE will be explained.

When the operation of the current output sensor SE is initiated, a sensor current Isen flows into the current output sensor SE, and the reference voltage VB is supplied to the positive input terminal of the operational amplifier OP. Then, due to the virtual shorting characteristics of the operational amplifier OP, the voltages of the negative input terminals of the operational amplifier OP and the input terminal WE are set to, and maintained at, the reference voltage VB supplied to the positive input terminal.

Because of the negative input terminal of the operational amplifier OP exhibiting an extremely high impedance, the sensor current Isen flowing into the current output sensor SE passes from the output side of the operational amplifier OP through the variable resistance circuit VR and into the current output sensor SE. Here, an output voltage VINP of the operational amplifier OP is set to a voltage obtained by adding the product of the resistance value RTIA of the variable resistance circuit VR and the sensor current Isen to the reference voltage VB.

That is, the output voltage VINP of the operational amplifier OP is expressed by Equation (1) as indicated below.

$$VINP = VB + RTIA \cdot Isen \quad (1)$$

As mentioned earlier, in the circuit of FIG. 1, the leakage current Iio is generated in the input/output circuit IO, and the leakage current Isw is generated in the variable resistance circuit VR. When the leakage currents Iio and Isw are generated, the current flowing through the variable resistance circuit VR is reduced. The error current of the leakage currents Iio and Isw produces an error in the effective resistance value of the variable resistance circuit VR. As the source voltage VDD increases, the leakage currents Isw generated at the switch circuits S0 to Sn of the variable resistance circuit VR will increase. This means that an increase in the source voltage VDD will lead to an increase in the error in the effective resistance value of the variable resistance circuit VR.

When the leakage currents Iio and Isw are taken into consideration, Equation (1) is actually expressed as in Equation (2).

$$VINP = VB + RTIA \cdot Isen - RTIA \cdot (Iio + Isw) \quad (2)$$

On the other hand, an output voltage VINN in the operational amplifier OPr of the transimpedance amplifier TIAr in the replica circuit (or error signal path) can be expressed as indicated below.

In the input/output circuit IOr and variable resistance circuit VRr of the replica circuit, leakage currents Iio and Isw are generated in a manner similar to the input/output circuit IO and variable resistance circuit VR in the measurement signal path.

The output voltage VINN of the operational amplifier OPr is therefore expressed by Equation (3) as indicated below.

$$VINN = VB - RTIA \cdot (Iio + Isw) \quad (3)$$

Here, the circuit elements of the input/output circuit IOr and variable resistance circuit VRr in the replica circuit, and their circuit constants, are the same as the circuit elements of the input/output circuit IO and variable resistance circuit VR in the measurement signal path, and their circuit constants. The leakage currents Iio and Isw generated in the replica circuit are therefore approximately the same as the leakage currents Iio and Isw in the measurement signal path, or in other words they substantially coincide with each other.

The output voltage VINP and output voltage VINN are input to the differential input analog-digital conversion circuit 11. The differential input analog-digital conversion circuit 11 obtains a difference between the output voltage VINP and output voltage VINN, digitizes it, and outputs an output signal DOUT. That is, the differential input analog-digital conversion circuit 11 removes an in-phase signal component between the output voltage VINP and output voltage VINN, converts the voltage from which the in-phase signal component has been removed to a digital value, and outputs the output signal DOUT.

The output signal DOUT therefore can be expressed by Equation (4) (=Equation (2)−Equation (3)).

$$DOUT = D(VINP - VINN) = D(RTIA \cdot Isen) \quad (4)$$

D(X) represents a conversion of an analog value X to a digital value X.

In this manner, an error that tends to be generated in the effective resistance value of the variable resistance circuit VR by the leakage currents Iio and Isw can be removed, as a result of which an output signal DOUT can be generated and obtained based on the product of the resistance value RTIA and sensor current Isen.

Figure 5:
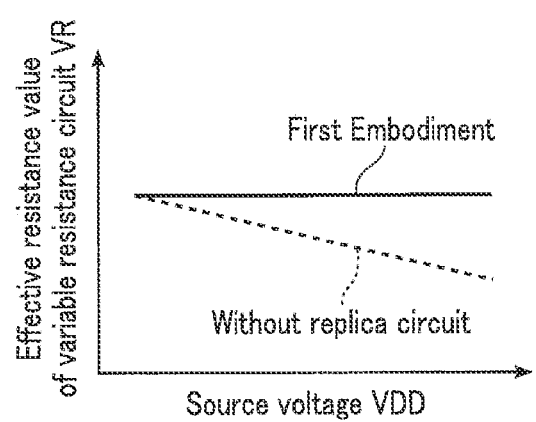
FIG. 5 is a diagram showing the relationship between an effective resistance value of a variable resistance circuit and a source voltage according to the first embodiment.

As described above, according to the present embodiment, an error in the effective resistance value of the variable resistance circuit VR generated by the leakage currents in the input/output circuit IO and variable resistance circuit VR can be reduced. Thus, the effective resistance value of the variable resistance circuit VR, which is a conversion gain in the transimpedance amplifier TIA, can be set to a constant value, regardless of the source voltage VDD. FIG. 5 shows the relationship between the effective resistance value of the variable resistance circuit VR and the source voltage VDD. As illustrated in FIG. 5, even if the source voltage VDD varies, the effective resistance value of the variable resistance circuit VR stays constant without being changed. With the effective resistance value of the variable resistance circuit VR being kept constant, the transimpedance amplifier TIA exhibits an accurate current-voltage conversion characteristic.

1.3 Effects of First Embodiment

According to the first embodiment, a semiconductor circuit having a transimpedance amplifier capable of accurately converting an input current to a voltage can be provided.

The effects of the first embodiment will be discussed below. A transimpedance amplifier for converting an input current to a voltage needs to be provided with a resistance circuit having an extremely high resistance value and a switch circuit for switching this resistance value in order to convert a minute input current to a large output voltage and to make the conversion gain variable.

When a high-resistance variable resistance circuit with a resistance adjusting function is mounted on a semiconductor silicon substrate, an error susceptibility issue may be raised: a leakage current in a switch circuit for switching the resistance and a leakage current in an ESD damage protection input/output circuit tend to create a significant error in the conversion gain for converting a current to a voltage at the transimpedance amplifier.

The semiconductor circuit 1 according to the first embodiment includes a transimpedance amplifier TIAr and an input/output circuit IOr, which are replicas of the transimpedance amplifier TIA and input/output circuit IO. The transimpedance amplifier TIAr and input/output circuit IOr are provided to accurately imitate the leakage currents Iio and Isw, which are the error factors of the conversion gain of the transimpedance amplifier TIA.

The differential input analog-digital conversion circuit 11 obtains a difference between the output voltage VINP of the transimpedance amplifier TIA and the output voltage VINN of the transimpedance amplifier TIAr, and thereby removes an error component in the output voltage VINP of the transimpedance amplifier TIA. The differential input analog-digital conversion circuit 11 further converts the voltage from which the error component has been removed to a digitized output signal DOUT.

According to the first embodiment, the transimpedance amplifier TIAr and input/output circuit IOr in the error signal path are constituted by the replica circuits of the transimpedance amplifier TIA and input/output circuit IO in the measurement signal path. With such a configuration, even if the source voltage VDD changes, which causes the leakage currents to change, or particularly even if the source voltage VDD increases, which causes the leakage current to increase, the leakage current in the error signal path increases in accordance with the increase in the leakage current in the measurement signal path. In other words, the transimpedance amplifier TIAr and input/output circuit IOr have circuit elements and circuit constant similar to those of the transimpedance amplifier TIA and input/output circuit IO. For this reason, even when the source voltage VDD changes, the leakage current in the error signal path and the leakage current in the measurement signal path change in a manner similar to each other, as a result of which their current amounts substantially coincide with each other.

When the leakage currents change due to a change in the temperature, the leakage current in the error signal path changes in accordance with a change in the leakage current in the measurement signal path. That is, even when the temperature changes, the leakage current in the error signal path and the leakage current in the measurement signal path change in a similar manner, as a result of which their current amounts substantially coincide with each other.

By obtaining a difference between the output voltage VINP of the transimpedance amplifier TIA in the measurement signal path and the output voltage VINN of the transimpedance amplifier TIAr in the error signal path, an error generated in the effective resistance value of the variable resistance circuit VR by the leakage currents in the measurement signal path can be removed, and the effective resistance value of the variable resistance circuit VR can thereby be maintained at a predetermined value. Thus, in the semiconductor circuit 1 according to the first embodiment, the input current can be accurately converted to a voltage, irrespective of a change in the source voltage VDD and temperature.

As discussed above, in the semiconductor circuit 1 according to the first embodiment, a transimpedance amplifier capable of accurately converting an input current to a voltage can be realized. In other words, a transimpedance amplifier with accurate current-voltage conversion characteristics can be realized.

The above first embodiment has been presented merely as an example, and is not intended to restrict the scope of the invention. The first embodiment may be embodied in various other modes.

2. SECOND EMBODIMENT

A semiconductor circuit according to a second embodiment will be explained below. In the above first embodiment, the output voltages of the transimpedance amplifiers TIA and TIAr are input to the differential input analog-digital conversion circuit. In the second embodiment, the output voltages of the transimpedance amplifiers TIA and TIAr are input to a single-end input analog-digital conversion circuit via a differential input/single-end output conversion amplifier. The explanation of the second embodiment will focus mainly on the points that differ from the first embodiment. The configurations and operations not mentioned here are the same as in the first embodiment.

2.1 Configuration of Semiconductor Circuit

FIG. 6 is a circuit diagram showing a configuration of a semiconductor circuit according to the second embodiment. The semiconductor circuit 2 includes two transimpedance amplifiers TIA and TIAr, two ESD damage protection input/output circuits IO and IOr, a differential input/single-end output conversion amplifier (or differential input amplification circuit) OPd, a single-end input analog-digital conversion circuit 12, and an input terminal WE.

The transimpedance amplifiers TIA and TIAr and input/output circuits IO and IOr of the semiconductor circuit 2 are the same as those in the first embodiment, and the explanation thereof is omitted.

The output terminal of the operational amplifier OP in the transimpedance amplifier TIA is coupled to a negative input terminal of the differential input/single-end output conversion amplifier OPd via a resistor Ra. The output terminal of the operational amplifier OPr in the transimpedance amplifier TIAr is coupled to a positive input terminal of the output conversion amplifier OPd via a resistor Ra. A voltage source for supplying the reference voltage VB is coupled to the positive input terminal of the conversion amplifier OPd via the resistor Rb. An output terminal of the differential input/single-end output conversion amplifier OPd is coupled to the negative input terminal of the conversion amplifier OPd via the resistor Rb.

Furthermore, the output terminal of the differential input/single-end output conversion amplifier OPd is coupled to an input terminal of the analog-digital conversion circuit 12. An output signal DOUT is output from an output terminal of the single-end input analog-digital conversion circuit 12.

2.2 Operation of Semiconductor Circuit

The operation of the semiconductor circuit 2 according to the second embodiment will be explained below.

The operation of the transimpedance amplifier TIA and input/output circuit IO in the measurement signal path and the operation of the transimpedance amplifier TIAr and input/output circuit IOr in the error signal path are the same as in the first embodiment. This means that the output voltage VINP is output from the operational amplifier OP in the transimpedance amplifier TIA, and the output voltage VINN is output from the operational amplifier OPr in the transimpedance amplifier TIAr.

The output voltage VINP is input to the negative input terminal of the differential input/single-end output conversion amplifier OPd, and the output voltage VINN is input to the positive input terminal of the conversion amplifier OPd. The conversion amplifier OPd obtains a difference between the output voltage VINP and output voltage VINN, and outputs an output voltage VOUT. That is, the conversion amplifier OPd removes an in-phase signal component between the output voltage VINP and output voltage VINN, and outputs the output voltage VOUT from which the in-phase signal component has been removed.

The analog-digital conversion circuit 12 converts the output voltage VOUT, which is an analog signal, to a digital value, and outputs the output signal DOUT.

According to the second embodiment, an error that tends to be generated in the effective resistance value of the variable resistance circuit VR by the leakage currents Iio and Isw can be removed, as a result of which an output signal DOUT can be generated and obtained based on the product of the resistance value RTIA and sensor current Isen, in the same manner as in the first embodiment.

2.3 Effects of Second Embodiment

According to the second embodiment, a semiconductor circuit having a transimpedance amplifier capable of accurately converting an input current to a voltage can be provided.

The semiconductor circuit 2 according to the second embodiment includes the transimpedance amplifier TIAr and the input/output circuit IOr, which are replicas of the transimpedance amplifier TIA and input/output circuit IO. The transimpedance amplifier TIAr and input/output circuit IOr are provided to accurately imitate the leakage currents Iio and Isw, which are the error factors of the conversion gain of the transimpedance amplifier TIA.

The differential input/single-end output conversion amplifier OPd obtains a difference between the output voltage VINP of the transimpedance amplifier TIA and the output voltage VINN of the transimpedance amplifier TIAr, and removes an error component in the output voltage VINP of the transimpedance amplifier TIA. The analog-digital conversion circuit 12 further converts the output voltage VOUT from which the error component has been removed to a digitized output signal DOUT.

According to the second embodiment, by obtaining a difference between the output voltage VINP of the transimpedance amplifier TIA in the measurement signal path and the output voltage VINN of the transimpedance amplifier TIAr in the error signal path, an error in the effective resistance value of the variable resistance circuit VR generated by the leakage currents in the measurement signal path can be removed, as a result of which the effective resistance value of variable resistance circuit VR can be maintained at a predetermined value. Thus, the semiconductor circuit 2 according to the second embodiment can accurately convert an input current to a voltage, irrespective of a change in the source voltage VDD or temperature.

The above second embodiment has been presented merely as an example, and is not intended to restrict the scope of the invention. The second embodiment may be embodied in various other modes.

3. THIRD EMBODIMENT

A semiconductor circuit 3 according to a third embodiment will be explained below. According to the third embodiment, a single transimpedance amplifier TIA is operated in a time-division manner. By performing a subtraction upon an output signal and subsequent signal, an error component in the output voltage of the transimpedance amplifier TIA is removed. The explanation of the third embodiment will focus mainly on the points that differ from the first embodiment. The configurations and operations not mentioned here are the same as in the first embodiment.

3.1 Configuration of Semiconductor Circuit

Figure 7:
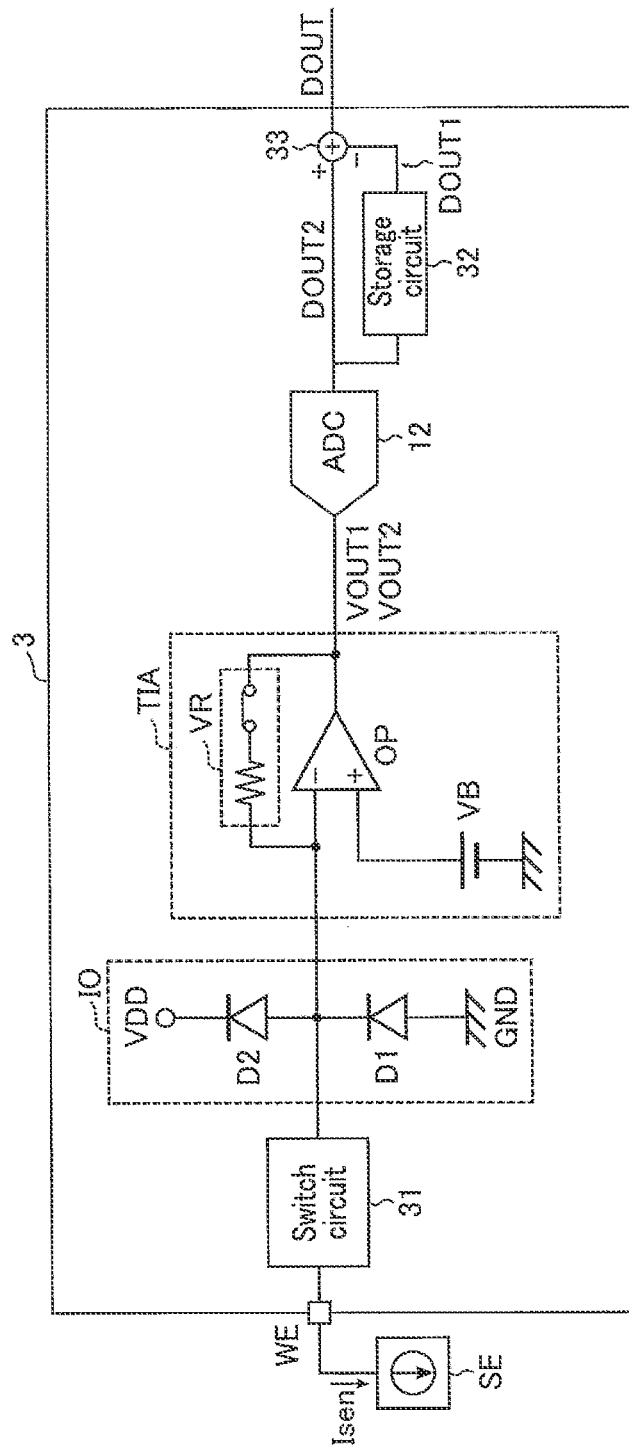
FIG. 7 is a circuit diagram showing a configuration of a semiconductor circuit according to a third embodiment.

FIG. 7 is a circuit diagram showing the configuration of the semiconductor circuit 3 according to the third embodiment. The semiconductor circuit 3 includes the transimpedance amplifier TIA, the ESD damage protection input/output circuit IO, the single-end input analog-digital conversion circuit 12, a switch circuit 31, a storage circuit 32, a subtractor 33, and an input terminal WE.

The transimpedance amplifier TIA, input/output circuit IO, and analog-digital conversion circuit 12 of the semiconductor circuit 3 are the same as those of the first and second embodiments, and the explanation is therefore omitted.

The switch circuit 31 is coupled between (i) the input terminal WE and (ii) the input/output circuit IO and transimpedance amplifier TIA. The output terminal of the operational amplifier OP in the transimpedance amplifier TIA is coupled to the input terminal of the analog-digital conversion circuit 12. The output terminal of the analog-digital conversion circuit 12 is coupled to the subtractor 33 via the storage circuit 32. The output terminal of the analog-digital conversion circuit 12 is also coupled to the subtractor 33 without the storage circuit 32 interposed. An output signal DOUT is output from the output terminal of the subtractor 33.

3.2 Operation of Semiconductor Circuit

The operation of the semiconductor circuit 3 according to the third embodiment will be explained below.

According to the third embodiment, the transimpedance amplifier TIA is operated in a time division manner. A subtraction is performed upon the outputs obtained through an operation when the switch circuit 31 is off (or in other words, in an unconnected state) and through an operation when the switch circuit 31 is on (or in other words, in a connected state), thereby obtaining an output signal DOUT.

Hereinafter, the operation executed when the switch circuit 31 is off will be referred to as an "off-state operation", and the operation executed when the switch circuit 31 is on will be referred to as an "on-state operation". The off-state operation corresponds to the operation in the error signal path (or replica circuit) according to the first embodiment, and the on-state operation corresponds to the operation in the measurement signal path according to the first embodiment.

First, the switch circuit 31 is set to an off state, where an off-state operation is executed. In the off-state operation, the output voltage VOUT1 of the operational amplifier OP in the transimpedance amplifier TIA is expressed as indicated below.

A leakage current Iio is generated at the input/output circuit IO, and a leakage current Isw is generated at the variable resistance circuit VR in the transimpedance amplifier TIA.

In consideration of the above, the output voltage VOUT1 of the operational amplifier OP can be expressed by Equation (5).

$$VOUT1 = VB + RTIA \cdot (Iio + Isw) \quad (5)$$

The output voltage VOUT1 is input to the analog-digital conversion circuit 12. The output voltage VOUT1 that has been input to the analog-digital conversion circuit 12 is converted from an analog signal to a digital signal, and is output as an output signal DOUT1. The output signal DOUT1 is input to the storage circuit 32, and stored in the storage circuit 32. The output signal DOUT1 is expressed by Equation (5a).

$$DOUT1 = D(VOUT1) = D(VB + RTIA \cdot (Iio + Isw)) \quad (5a)$$

Following the off-state operation, the switch circuit 31 is set to an on state, where an on-state operation is executed. In the on-state operation, the output voltage VOUT2 of the operational amplifier OP in the transimpedance amplifier TIA is expressed as indicated below.

When the switch circuit 31 is set to the on state, a current Isen flows into the transimpedance amplifier TIA, and the reference voltage VB is supplied to the positive input terminal of the operational amplifier OP. In the on-state operation, the leakage current Iio is generated in the input/output circuit IO, and the leakage current Isw is generated in the variable resistance circuit VR in the transimpedance amplifier TIA, in a manner similar to the off-state operation.

In consideration of the above, the output voltage VOUT2 of the operational amplifier OP can be expressed by Equation (6).

$$VOUT2 = VB + RTIA \cdot (Isen + Iio + Isw) \quad (6)$$

The output voltage VOUT2 is input to the analog-digital conversion circuit 12. The output voltage VOUT2 that has been input to the analog-digital conversion circuit 12 is converted from an analog signal to a digital signal, and is output as an output signal DOUT2. The output signal DOUT2 is input to the subtractor 33. The output signal DOUT2 is expressed by Equation (6a).

$$DOUT2 = D(VOUT2) = D(VB + RTIA \cdot (Isen + Iio + Isw)) \quad (6a)$$

Next, the subtractor 33 subtracts the output signal DOUT1 from the output signal DOUT2, thereby outputting an output signal DOUT. The output signal DOUT is expressed by Equation (7) (=Equation (6a)−Equation (5a)).

$$DOUT = DOUT2 - DOUT1 = D(RTIA \cdot Isen) \quad (7)$$

In this manner, an error that tends to be generated in the effective resistance value of the variable resistance circuit VR by the leakage currents Iio and Isw can be removed, as a result of which an output signal DOUT can be generated and obtained based on the product of the resistance value RTIA and sensor current Isen.

3.3 Effects of Third Embodiment

According to the third embodiment, a transimpedance amplifier configured to accurately convert an input current to a voltage can be provided.

The semiconductor circuit 3 according to the third embodiment includes the switch circuit 31 between (i) the transimpedance amplifier TIA and input/output circuit IO and (ii) the input terminal WE, and also includes the storage circuit 32 and the subtractor 33 on the output stage of the analog-digital conversion circuit 12. First, the transimpedance amplifier TIA is operated with the switch circuit 31 set to an off state. As a result, an output voltage VOUT1 generated by the leakage currents Iio and Isw, which are error factors in the conversion gain of the transimpedance amplifier TIA, is output from the transimpedance amplifier TIA. The output voltage VOUT1 is converted by the analog-digital conversion circuit 12 to a digitized output signal DOUT1, and the output signal DOUT1 is stored in the storage circuit 32.

Next, the transimpedance amplifier TIA is operated with the switch circuit 31 set to an on state. As a result, an output voltage VOUT2 generated by the sensor current Isen and leakage currents Iio and Isw is output from the transimpedance amplifier TIA. The output voltage VOUT2 is converted by the analog-digital conversion circuit 12 to a digitized output signal DOUT2, and the output signal DOUT2 is output to the subtractor 33. The subtractor 33 subtracts the output signal DOUT1 from the output signal DOUT2 to remove the error component from the output signal DOUT2. The output signal DOUT from which the error component has been removed is output from the subtractor 33.

According to the third embodiment, the output signal DOUT1 of the transimpedance amplifier TIA obtained when the switch circuit 31 is off is subtracted from the output signal DOUT2 of the transimpedance amplifier TIA obtained when the switch circuit 31 is on to remove the errors generated by the leakage currents in the effective resistance value of the variable resistance circuit VR when the switch circuit 31 is on. Thus, the effective resistance value of the variable resistance circuit VR can be maintained at a predetermined value. Thus, the semiconductor circuit 3 according to the third embodiment can accurately convert the input current to a voltage, irrespective of a change in the source voltage VDD and temperature.

Furthermore, according to the third embodiment, the circuit configuration of the semiconductor circuit 3, which does not require a replica circuit containing a transimpedance amplifier TIAr, can be simplified in comparison with the first and second embodiments.

The above third embodiment has been presented merely as an example, and is not to restrict the scope of the invention. The third embodiment may be embodied in various other modes.

4. FOURTH EMBODIMENT

The semiconductor circuit according to a fourth embodiment will be explained below. Various types of circuits can be coupled to the negative input terminal of the operational amplifier OP in the transimpedance amplifier TIA to test the operation of the transimpedance amplifier TIA. Here, an example in which a failure detection circuit is coupled to the negative input terminal of the operational amplifier OP to detect the presence/absence of a failure in the transimpedance amplifier TIA will be dealt with. The explanation of the fourth embodiment will focus mainly on the points that differ from the first embodiment. The configurations and operations not mentioned here are the same as in the first embodiment.

4.1 Configuration of Semiconductor Circuit

Figure 8:
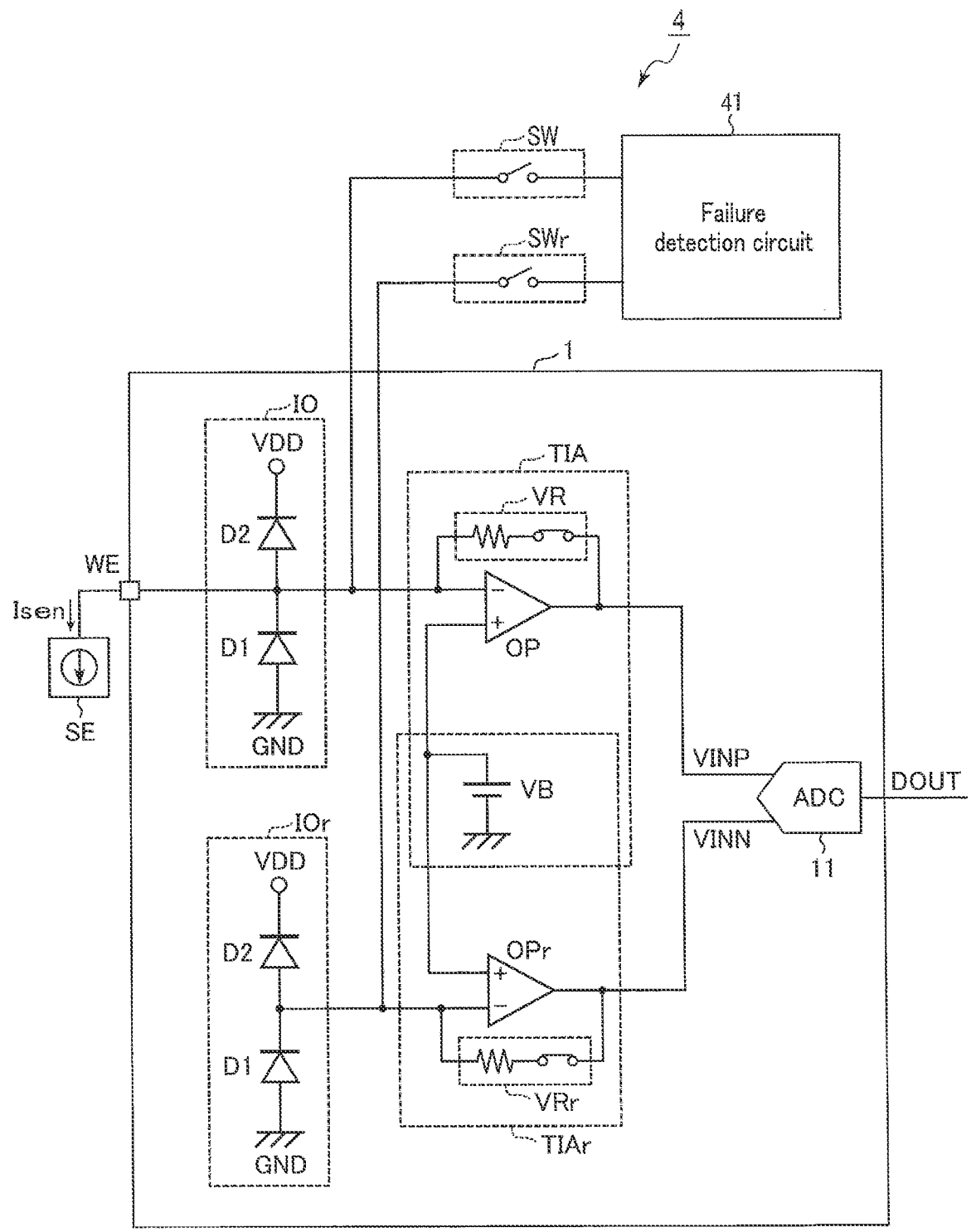
FIG. 8 is a circuit diagram showing a configuration of a semiconductor circuit according to a fourth embodiment.

FIG. 8 is a circuit diagram showing a configuration of a semiconductor circuit according to the fourth embodiment. The semiconductor circuit 4 according to the fourth embodiment includes, in addition to the configuration of the semiconductor circuit 1 described in the first embodiment, a failure detection circuit 41, and switch circuits SW and SWr. The semiconductor circuit 1 illustrated in FIG. 8 is the same as the semiconductor circuit 1 described in the first embodiment, and therefore the explanation thereof is omitted.

As illustrated in FIG. 8, the negative input terminal of the operational amplifier OP in the transimpedance amplifier TIA is coupled to the failure detection circuit 41 via the switch circuit SW. The negative input terminal of the operational amplifier OPr in the transimpedance amplifier TIAr is coupled to the failure detection circuit 41 via the switch circuit SWr.

The failure detection circuit 41 is configured to detect the voltage of the negative input terminal of the operational amplifier OP in the transimpedance amplifier TIA (hereinafter referred to as a "first detection voltage") and the voltage of the negative input terminal of the operational amplifier OPr in the transimpedance amplifier TIAr (hereinafter referred to as a "second detection voltage"), and to detect the presence or absence of a failure in the transimpedance amplifier TIA based on the detected first detection voltage and second detection voltage.

The failure detection circuit 41 may include an analog-digital conversion circuit and a judgment circuit. The analog-digital conversion circuit detects first and second detection voltages respectively from the transimpedance amplifier TIA and transimpedance amplifier TIAr, and converts the first and second detection voltages to respective digital signals to output the first and second output signals. The judgment circuit is coupled to an output stage of the analog-digital conversion circuit. Based on the first and second output signals output by the analog-digital conversion circuit, the judgment circuit determines whether or not the transimpedance amplifier TIA is operating normally, and outputs the determination result.

The switch circuit SW is coupled between the negative input terminal of the operational amplifier OP and the failure detection circuit 41. The switch circuit SW sets the state between the negative input terminal of the operational amplifier OP and the failure detection circuit 41 to a connected state (closed state or on state) or to an unconnected state (open state or off state).

The switch circuit SWr is coupled between the negative input terminal of the operational amplifier OPr and the failure detection circuit 41. The switch circuit SWr sets the state between the negative input terminal of the operational amplifier OPr and the failure detection circuit 41 to a connected state or to an unconnected state.

The switch circuit SWr has a circuit configuration similar to that of the switch circuit SW. In other words, the switch circuit SWr has circuit elements and a circuit constant similar to those of the switch circuit SW. Each of the switch circuits SW and SWr is formed of a transistor (e.g., MOS field-effect transistor).

A leakage current Iswa may be generated in each of the switch circuits SW and SWr. As mentioned earlier, the switch circuit SWr has a circuit configuration similar to that of the switch circuit SW. For this reason, the leakage current Iswa generated in the switch circuit SW and the leakage current Iswa generated in the switch circuit SWr substantially coincide with each other, or in other words they exhibit approximately the same current value.

4.2 Operation of Semiconductor Circuit

The operation of the semiconductor circuit 4 according to the fourth embodiment will be explained below.

When the semiconductor circuit 1 of FIG. 8 is activated and used in a normal manner, the switch circuits SW and SWr are set to an unconnected state.

In the measurement signal path of the semiconductor circuit 4, the leakage current Iio is generated in the input/output circuit IO, the leakage current Isw is generated in the variable resistance circuit VR, and the leakage current Iswa is generated in the switch circuit SW. When the leakage currents Iio, Isw, and Iswa are generated, the current flowing through the variable resistance circuit VR is reduced. The leakage currents Iio, Isw, and Iswa therefore may produce an error in the effective resistance value of the variable resistance circuit VR.

On the other hand, in the input/output circuit IOr, variable resistance circuit VRr, and switch circuit SWr in the replica circuit (or in the error signal path), leakage currents Iio, Isw, and Iswa are generated in the same manner as in the input/output circuit IO, variable resistance circuit VR, and switch circuit SW in the measurement signal path.

Here, the input/output circuit IOr, variable resistance circuit VRr, and switch circuit SWr in the replica circuit have circuit configurations similar to those of the input/output circuit IO, variable resistance circuit VR, and switch circuit SW, respectively, in the measurement signal path. For instance, the circuit elements and their circuit constants of the input/output circuit IOr, variable resistance circuit VRr, and switch circuit SWr in the replica circuit are the same as the circuit elements and their circuit constants of the input/output circuit IO, variable resistance circuit VR, and switch circuit SW, respectively, in the measurement signal path. For this reason, the leakage currents Iio, Isw, and Iswa generated in the replica circuit are substantially the same as the leakage currents Iio, Isw, and Iswa generated in the measurement signal path, or in other words they substantially coincide with each other.

The output voltages VINP and VINN output by the operational amplifiers OP and OPr are expressed by the following equations:

$$VINP = VB + RTIA \cdot Isen - RTIA \cdot (Iio + Isw + Iswa) \quad (8)$$

$$VINN = VB - RTIA \cdot (Iio + Isw + Iswa) \quad (9)$$

Thus, the output signal DOUT output by the differential input analog-digital conversion circuit 11 is expressed by Equation (10) (=Equation (8)−Equation (9)).

$$DOUT = D(VINP - VINN) = D(RTIA \cdot Isen) \quad (10)$$

In this manner, an error that tends to be produced in the effective resistance value of the variable resistance circuit VR by the leakage currents Iio, Isw, and Iswa can be removed, as a result of which an output signal DOUT can be generated and obtained based on the product of the resistance value RTIA and the sensor current Isen.

On the other hand, when the semiconductor circuit 1 is activated and a test is conducted upon the transimpedance amplifier TIA, the switch circuits SW and SWr are set to a connected state. When the switch circuits SW and SWr are set to a connected state, a leakage current is generated from each of the switch circuits SW and SWr. As mentioned earlier, the switch circuit SWr has a circuit configuration similar to that of the switch circuit SW. For instance, the circuit elements and their circuit constants of the switch circuit SWr are the same as the circuit elements and their circuit constants of the switch circuit SW. Thus, the leakage current Iswa generated in the switch circuit SWr and the leakage current Iswa generated in the switch circuit SW exhibit approximately the same current value, or in other words they substantially coincide with each other.

To the failure detection circuit 41, the first detection voltage at the negative input terminal of the operational amplifier OP in the transimpedance amplifier TIA is input via the switch circuit SW, and the second detection voltage at the negative input terminal of the operational amplifier OPr in the transimpedance amplifier TIAr is input via the switch circuit SWr. Using the first detection voltage and second detection voltage, the failure detection circuit 41 corrects an error in the first detection voltage generated by the leakage current Iswa, and detects the presence or absence of a failure in the transimpedance amplifier TIA based on the corrected first detection voltage.

4.3 Effects of Fourth Embodiment

The semiconductor circuit 4 according to the fourth embodiment provides a transimpedance amplifier capable of accurately converting an input current to a voltage in the same manner as in the first embodiment.

Furthermore, in the semiconductor circuit 4 of the fourth embodiment, since the switch circuit SWr has a circuit configuration similar to that of the switch circuit SW, substantially the same leakage current Iswa is generated in the switch circuit SW and switch circuit SWr. According to the fourth embodiment, the failure detection circuit 41 is configured to correct an error in the first detection voltage, which has been produced by the leakage currents Iio, Isw, and Iswa, based on the first detection voltage at the input terminal of the transimpedance amplifier TIA and the second detection voltage at the input terminal of the transimpedance amplifier TIAr. Thus, according to the fourth embodiment, whether or not there is a failure in the transimpedance amplifier TIA can be accurately detected, based on the corrected first detection voltage.

The above fourth embodiment has been presented merely as an example, and is not intended to restrict the scope of the invention. The fourth embodiment may be embodied in various other modes.

5. OTHER MODIFICATION EXAMPLES

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor circuit comprising:
   a first transimpedance amplifier having a first input terminal, a second input terminal, and a first output terminal, the first transimpedance amplifier being configured to convert an input current to a first output voltage and output the first output voltage from the first output terminal when a reference voltage is supplied to the first input terminal and the input current is supplied to the second input terminal;
   a second transimpedance amplifier having a third input terminal, a fourth input terminal, and a second output terminal, the second transimpedance amplifier having a circuit configuration similar to a circuit configuration of the first transimpedance amplifier and configured to output a second output voltage from the second output terminal when the reference voltage is supplied to the third input terminal;
   a differential input amplification circuit configured to remove an in-phase signal component between the first output voltage and the second output voltage; and
   an analog-digital conversion circuit configured to convert a voltage from which the in-phase signal component has been removed by the differential input amplification circuit to a digital value.

2. The semiconductor circuit according to claim 1, further comprising:
   a first electro-static discharge (ESD) protection circuit coupled to the second input terminal of the first transimpedance amplifier; and
   a second ESD protection circuit coupled to the fourth input terminal of the second transimpedance amplifier and having a circuit element similar to a circuit element of the first ESD protection circuit, wherein the first transimpedance amplifier includes a first variable resistance circuit coupled between the second input terminal and the first output terminal and configured to have a variable resistance value, and the second transimpedance amplifier includes a second variable resistance circuit coupled between the fourth input terminal and the second output terminal, configured to have a variable resistance value, and having a circuit element similar to a circuit element of the first variable resistance circuit.

3. The semiconductor circuit according to claim 2, wherein the first ESD protection circuit and the second ESD protection circuit both have a first circuit constant, and the first variable resistance circuit and the second variable resistance circuit both have a second circuit constant.

4. The semiconductor circuit according to claim 2, wherein the first ESD protection circuit includes a first diode and a second diode, the first diode is coupled between a ground voltage node to which a ground voltage is supplied and the second input terminal, and the second diode is coupled between the second input terminal and a source voltage node to which a source voltage is supplied, the second ESD protection circuit includes a third diode and a fourth diode, and the third diode is coupled between the ground voltage node and the fourth input terminal, and the fourth diode is coupled between the fourth input terminal and the source voltage node.

5. The semiconductor circuit according to claim 2, wherein the first ESD protection circuit includes a first transistor and a second transistor, a gate and a drain of the first transistor are coupled to a ground voltage node to which a ground voltage is supplied, and a source of the first transistor is coupled to the second input terminal, a gate and a drain of the second transistor are coupled to a source voltage node to which a source voltage is supplied, and a source of the second transistor is coupled to the second input terminal, the second ESD protection circuit includes a third transistor and a fourth transistor, a gate and a drain of the third transistor are coupled to the ground voltage node, and a source of the third transistor is coupled to the fourth input terminal, and a gate and a drain of the fourth transistor are coupled to the source voltage node, and a source of the fourth transistor is coupled to the fourth input terminal.

6. The semiconductor circuit according to claim 2, wherein the first variable resistance circuit includes a plurality of first resistors and a plurality of first transistors coupled to the first resistors, and the second variable resistance circuit includes a plurality of second resistors and a plurality of second transistors coupled to the second resistors.

7. The semiconductor circuit according to claim 1, further comprising:

a differential input analog-digital conversion circuit configured to remove an in-phase signal component between the first output voltage and the second output voltage and convert a voltage from which the in-phase signal component has been removed to a digital value.

8. A semiconductor circuit comprising:

a transimpedance amplifier having a first input terminal, a second input terminal, and an output terminal, the transimpedance amplifier being configured to convert an input current to an output voltage and output the output voltage from the output terminal when a reference voltage is supplied to the first input terminal and the input current is supplied to the second input terminal;

a switch circuit configured to supply the input current to the second input terminal or interrupt supply of the input current;

an analog-digital conversion circuit configured to convert the output voltage to a digital value and output a first signal and a second signal;

a storage circuit configured to store the first signal output from the analog-digital conversion circuit; and a subtractor configured to subtract the first signal stored in the storage circuit from the second signal output from the analog-digital conversion circuit, wherein, when the supply of the input current to the second input terminal is interrupted by the switch circuit, the transimpedance amplifier outputs a first output voltage, the analog-digital conversion circuit converts the first output voltage to the first signal, and the storage circuit stores the first signal, and when the input current is supplied to the second input terminal by the switch circuit, the transimpedance amplifier outputs a second output voltage, the analog-digital conversion circuit converts the second output voltage to the second signal, and the subtractor subtracts the first signal stored in the storage circuit from the second signal.

9. The semiconductor circuit according to claim 8, wherein the transimpedance amplifier includes a variable resistance circuit coupled between the second input terminal and the first output terminal and configured to have a variable resistance value.

10. The semiconductor circuit according to claim 1, further comprising:

a first circuit coupled to the second input terminal of the first transimpedance amplifier; and a second circuit coupled to the fourth input terminal of the second transimpedance amplifier and having a circuit element similar to a circuit element of the first circuit.

11. The semiconductor circuit according to claim 10, wherein the first circuit includes a first switch circuit, and the second circuit includes a second switch circuit, and the first switch circuit and the second switch circuit both have a third circuit constant.

12. The semiconductor circuit according to claim 11, further comprising:

a detection circuit coupled to the first switch circuit and the second switch circuit.

13. The semiconductor circuit according to claim 9, wherein the variable resistance circuit includes a plurality of resistors and a plurality of transistors coupled to the resistors.

14. The semiconductor circuit according to claim 8, further comprising an electro-static discharge (ESD) protection circuit coupled to the second input terminal of the transimpedance amplifier.

15. The semiconductor circuit according to claim 14, wherein
- the ESD protection circuit includes a first diode and a second diode, and
- the first diode is coupled between a ground voltage node to which a ground voltage is supplied and the second input terminal, and the second diode is coupled between the second input terminal and a source voltage node to which a source voltage is supplied.

16. The semiconductor circuit according to claim 14, wherein
- the ESD protection circuit includes a first transistor and a second transistor,
- a gate and a drain of the first transistor are coupled to a ground voltage node to which a ground voltage is supplied, and a source of the first transistor is coupled to the second input terminal, and
- a gate and a drain of the second transistor are coupled to a source voltage node to which a source voltage is supplied, and a source of the second transistor is coupled to the second input terminal.

\* \* \* \* \*